(12) United States Patent
Schwarz et al.

(10) Patent No.: US 12,095,015 B2
(45) Date of Patent: Sep. 17, 2024

(54) OPTOELECTRONIC LIGHT EMITTING DEVICE AND MANUFACTURING METHOD

(71) Applicant: OSRAM Opto Semiconductors GmbH, Regensburg (DE)

(72) Inventors: Thomas Schwarz, Regensburg (DE); Andreas Dobner, Wenzenbach (DE); Frank Singer, Regenstauf (DE); Stefan Groetsch, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 497 days.

(21) Appl. No.: 17/414,861

(22) PCT Filed: Dec. 17, 2019

(86) PCT No.: PCT/EP2019/085639
§ 371 (c)(1),
(2) Date: Jun. 16, 2021

(87) PCT Pub. No.: WO2020/127257
PCT Pub. Date: Jun. 25, 2020

(65) Prior Publication Data
US 2022/0020904 A1 Jan. 20, 2022

(30) Foreign Application Priority Data
Dec. 17, 2018 (DE) .................... 10 2018 132 542.8

(51) Int. Cl.
*H01L 33/60* (2010.01)
*H01L 25/075* (2006.01)
(Continued)

(52) U.S. Cl.
CPC .......... *H01L 33/60* (2013.01); *H01L 25/0753* (2013.01); *H01L 33/005* (2013.01);
(Continued)

(58) Field of Classification Search
CPC ....... H01L 33/60; H01L 33/005; H01L 33/50; H01L 25/0753
See application file for complete search history.

(56) References Cited

U.S. PATENT DOCUMENTS 6,410,940 B1 6/2002 Jiang et al.
8,177,408 B1 * 5/2012 Coleman ................ G02B 3/005
362/621
(Continued)

FOREIGN PATENT DOCUMENTS

DE 10 2009 033 287 A1 1/2011
DE 10 2010 009 717 A1 9/2011
(Continued)

OTHER PUBLICATIONS

International Search Report issued for corresponding International Patent Application No. PCT/EP2019/085639 on Mar. 16, 2020, along with an English translation.
(Continued)

*Primary Examiner* — Nathan W Ha
(74) *Attorney, Agent, or Firm* — HAUPTMAN HAM, LLP

(57) ABSTRACT

An optoelectronic light emitting device includes a pixel with a transparent or translucent carrier substrate, on which a semiconductor light emitting arrangement with at least one micro LED is arranged. The micro LED extends over a partial area of the pixel. The main radiation direction of the semiconductor light emitting arrangement is directed onto a backscattering surface element arranged behind the transparent carrier substrate in viewing direction. The semiconductor light emitting arrangement includes a beam shaping element.

15 Claims, 5 Drawing Sheets

(51) Int. Cl.
*H01L 33/00* (2010.01)
*H01L 33/50* (2010.01)

(52) U.S. Cl.
CPC ...... *H01L 33/50* (2013.01); *H01L 2933/0058* (2013.01); *H01L 2933/0091* (2013.01)

(56) References Cited

U.S. PATENT DOCUMENTS

| | | | |
|---|---|---|---|
| 8,928,021 B1 | 1/2015 | Bibl et al. | |
| 10,215,937 B1* | 2/2019 | Wu | H01L 33/52 |
| 10,330,777 B2* | 6/2019 | Popovich | G02B 27/0093 |
| 11,637,219 B2* | 4/2023 | He | H01L 33/06 |
| | | | 257/79 |
| 11,641,008 B2* | 5/2023 | Lee | H01L 27/156 |
| | | | 257/79 |
| 11,705,481 B2* | 7/2023 | Kim | H01L 33/62 |
| | | | 257/88 |
| 2004/0218390 A1* | 11/2004 | Holman | H04N 9/315 |
| | | | 257/E33.072 |
| 2006/0043879 A1* | 3/2006 | Naitou | H01L 33/60 |
| | | | 313/501 |
| 2007/0086211 A1* | 4/2007 | Beeson | H01L 33/60 |
| | | | 362/616 |
| 2008/0037252 A1* | 2/2008 | Nii | H01L 24/49 |
| | | | 257/E33.059 |
| 2009/0052157 A1* | 2/2009 | Katabe | H01L 33/507 |
| | | | 362/84 |
| 2010/0039707 A1* | 2/2010 | Akahane | G02B 3/0087 |
| | | | 359/321 |
| 2011/0096526 A1* | 4/2011 | Katabe | H01L 33/60 |
| | | | 362/84 |
| 2011/0146769 A1* | 6/2011 | Hoffbauer | H01L 31/075 |
| | | | 438/94 |
| 2011/0176076 A1* | 7/2011 | Van Bommel | F21V 13/08 |
| | | | 349/22 |
| 2012/0112220 A1* | 5/2012 | West | H01L 33/62 |
| | | | 257/E33.072 |
| 2012/0262941 A1* | 10/2012 | Min | G02B 6/005 |
| | | | 257/E33.012 |
| 2013/0009183 A1* | 1/2013 | Han | H01L 33/60 |
| | | | 257/E33.059 |
| 2013/0010495 A1* | 1/2013 | Moon | F21V 29/70 |
| | | | 362/609 |
| 2013/0026499 A1* | 1/2013 | Odnoblyudov | H01L 33/507 |
| | | | 257/E33.001 |
| 2013/0063024 A1* | 3/2013 | Wada | H01L 33/56 |
| | | | 313/512 |
| 2013/0271731 A1* | 10/2013 | Popovich | G01J 3/1895 |
| | | | 353/31 |
| 2013/0299816 A1* | 11/2013 | Bessho | H01L 33/50 |
| | | | 257/40 |
| 2014/0117396 A1* | 5/2014 | Eisert | H01L 33/52 |
| | | | 438/27 |
| 2016/0149101 A1 | 5/2016 | Singer et al. | |
| 2016/0178907 A1 | 6/2016 | Chang et al. | |
| 2016/0284674 A1* | 9/2016 | Kim | F21V 7/0008 |
| 2016/0360967 A1* | 12/2016 | Nishiwaki | G01J 1/0422 |
| 2017/0038669 A1* | 2/2017 | Bierhuizen | G03B 21/13 |
| 2017/0062674 A1* | 3/2017 | Kwon | H01L 25/0753 |
| 2017/0069681 A1* | 3/2017 | Lee | H01L 33/54 |
| 2017/0082785 A1* | 3/2017 | Verschuuren | G02F 1/29 |
| 2017/0148959 A1* | 5/2017 | Haiberger | H01L 33/486 |
| 2017/0155022 A1* | 6/2017 | Tomonari | H01L 33/647 |
| 2017/0186921 A1* | 6/2017 | Kim | H01L 33/504 |
| 2017/0242549 A1* | 8/2017 | Lim | G06F 3/0421 |
| 2017/0294480 A1* | 10/2017 | Kwon | H01L 27/14627 |
| 2017/0336035 A1 | 11/2017 | Lin et al. | |
| 2018/0023784 A1* | 1/2018 | Tamura | F21V 9/08 |
| | | | 362/235 |
| 2018/0076182 A1* | 3/2018 | Wu | H01L 25/0753 |
| 2018/0083218 A1* | 3/2018 | Choi | H10K 50/814 |
| 2018/0180249 A1* | 6/2018 | Yamada | H01L 33/505 |
| 2018/0299259 A1* | 10/2018 | Shchegrov | G01N 23/201 |
| 2018/0351052 A1* | 12/2018 | Yoo | C03B 23/20 |
| 2019/0041634 A1* | 2/2019 | Popovich | G02B 6/00 |
| 2019/0063723 A1* | 2/2019 | Yamada | H01L 33/0075 |
| 2019/0094564 A1* | 3/2019 | Rivera | G02B 27/48 |
| 2019/0186711 A1* | 6/2019 | Lenef | F21V 7/30 |
| 2019/0235677 A1* | 8/2019 | Liu | G06F 3/042 |
| 2019/0295993 A1* | 9/2019 | Kudaev | H01L 33/504 |
| 2019/0393387 A1* | 12/2019 | Kwon | H01L 33/60 |
| 2020/0018684 A1* | 1/2020 | Vercruysse | G01N 15/1436 |
| 2020/0124834 A1* | 4/2020 | Woodgate | G02B 19/0066 |
| 2020/0144228 A1* | 5/2020 | Brick | H01L 33/52 |
| 2021/0184088 A1* | 6/2021 | Kwon | H01L 33/60 |

FOREIGN PATENT DOCUMENTS

| | | |
|---|---|---|
| DE | 10 2011 003 988 A1 | 8/2012 |
| DE | 10 2011 015 726 A1 | 10/2012 |
| DE | 10 2013 104 046 A1 | 10/2014 |
| DE | 10 2013 218 268 A1 | 3/2015 |
| DE | 10 2016 106 494 A1 | 10/2017 |
| DE | 10 2017 104 871 A1 | 9/2018 |
| DE | 10 2017 113 745 A1 | 12/2018 |
| EP | 3 240 037 A1 | 11/2017 |
| EP | 3 396 434 A1 | 10/2018 |
| JP | 2006-227408 A | 8/2006 |
| KR | 10-2011-0107631 A | 10/2011 |
| WO | 2009/066398 A1 | 5/2009 |
| WO | 2011/082497 A1 | 7/2011 |
| WO | 2011/117934 A1 | 9/2011 |
| WO | 2012/081536 A1 | 6/2012 |
| WO | 2013/059489 A1 | 4/2013 |
| WO | 2017/139245 A1 | 8/2017 |
| WO | 2018/026851 A1 | 2/2018 |
| WO | 2018/050921 A1 | 3/2018 |

OTHER PUBLICATIONS

Written Opinion issued for corresponding International Patent Application No. PCT/EP2019/085639 on Mar. 16, 2020.

* cited by examiner

OPTOELECTRONIC LIGHT EMITTING DEVICE AND MANUFACTURING METHOD

CROSS REFERENCE TO RELATED APPLICATION

This application is a National Stage of International Application No. PCT/EP2019/085639, filed on Dec. 17, 2019, which designates the United States and was published in Europe, and which claims priority to German Patent Application No. 10 2018 132 542.8, filed on Dec. 17, 2018, in the German Patent Office. Both of the aforementioned applications are hereby incorporated by reference in their entireties.

The invention relates to an optoelectronic light emitting device and a method for manufacturing the optoelectronic light emitting device.

Semiconductor light sources with edge lengths smaller than 100 µm and typically smaller than 25 µm are known, for example, from U.S. Pat. No. 6,410,940 B1 and are referred to as micro LEDs (µLEDs) in the application as p-n light emitting diodes. Micro LEDs mostly based on indium gallium nitride (InGaN) and comprising at least one quantum well exhibit higher energy efficiency than conventional-sized light emitting diodes or carbon-based light emitting diodes (OLEDs) and are also long-lasting. Their application for high-resolution displays of mobile devices and for large-format optoelectronic light emitting devices is correspondingly advantageous.

For spectral adjustment of the light emission, micro LEDs can be connected with wavelength converters to form packages.

From U.S. Pat. No. 8,928,021 B1 an arrangement with at least one micro LED, a light guiding structure covering it and a cladding with a phosphor material containing quantum wells as wavelength converter is known.

WO 2011/082497 A1 discloses an optoelectronic package with at least one bottom-emitting LED as a light source, which is arranged on one side of a transparent carrier substrate. On the substrate side opposite the light source, there is a phosphor layer for spectral adaptation of the light visible to the observer. Furthermore, alternative embodiments are described for which the electromagnetic radiation emitted by the LED first strikes a backside reflector before entering the phosphor layer.

Furthermore, primary optics on LEDs, light guiding elements directly connected to them, and reflective beam guides that form semiconductor light emitting arrangements with LEDs are known. Exemplary reference is made to US 2016/0149 101 A1, DE 10 2017 104 871 A1, DE 10 2011 003 988 A1, DE 10 2009 033 287 A1, DE 10 2010 009 717 A1, DE 10 2011 015 726 A1, DE 10 2016 106 494 A1 and DE 10 2013 218 268 A1.

The small-area active layer of micro LEDs leads to significant differences between spot-illuminated and dark areas when viewing a single pixel area in typical applications with a low packing density. This so-called door shadow effect (screen door effect) is particularly evident at a low viewing distance and thus especially in applications such as VR glasses- or video walls with a large pixel pitch. Sub-pixel structures are usually noticed and perceived as annoying when the illumination difference within a pixel continues periodically across the matrix arrangement of the display.

To solve this problem, US 2017/0062674 A1 proposes to surround vertically emitting micro LEDs with light guides that act as diffusers and beam expanders in the viewing direction. The light guides extend between optical isolators that separate the illumination of adjacent pixels.

Furthermore, US 2016/0178907 A1 describes a semiconductor display for which the light emitted by a small-area light source in the direction of the observer is directed via a widening diffuser to a pixel-filling lens that produces an essentially parallel beam path in the further course of the beam. Another proposal for reducing the screen door effect with the aid of an arrangement of micro lenses and associated apertures in front of the semiconductor light sources in the viewing direction can be found in EP 3 240 037 A1.

Furthermore, EP 3 396 434 A1 proposes to place refractive gratings above the light sources that only partially fill the pixel area in order to increase the illumination area. Further refractive optics for improving the pixel illumination level are described by WO 2017/139245 A1. Alternatives designate WO 2018/026851 A1 and WO 2013/059489 A1, with WO 2018/026851 A1 disclosing the use of phase optical components. WO 2013/059489 A proposes to arrange a plate-shaped translucent diffuser element in front of a small-area light source in the viewing direction at a distance adapted to the aperture angle of light generation in such a way that pixels appear illuminated but still optically separated from neighboring pixels. This leads to a display that is large in the main beam direction and to intensity losses. Furthermore, the aforementioned measures to reduce the screen door effect require additional optical components to be positioned separately, which complicates the manufacturing of optoelectronic light emitting devices comprising micro LEDs.

One object of the invention is to reduce the screen door effect for an optoelectronic light emitting device with at least one micro LED occupying a partial pixel area by using as few individually components to be handled per pixel as possible. At the same time, the overall arrangement should have a small overall depth in the viewing direction. In addition, a method for manufacturing the optoelectronic light emitting device shall be specified.

The object is solved by the features of claim 1 or by the features of claim 14, insofar as this is regarded as an independent claim. The object regarding the manufacturing method is solved by the features of claim 15.

An optoelectronic light emitting device according to the invention comprises at least one pixel with a transparent or translucent carrier substrate, on which optionally a pixel micro control unit and a semiconductor light emitting arrangement with at least one micro LED, which extends over a partial area of the pixel, are arranged, wherein a main radiation direction of the semiconductor light emitting arrangement is directed onto a backscattering surface element arranged behind the transparent or translucent carrier substrate in viewing direction, and wherein the semiconductor light emitting arrangement comprises a beam shaping element.

In the optoelectronic light emitting device according to the invention, a homogeneous and large-area illumination of a pixel with electromagnetic radiation emanating from a small-format micro LED can be achieved by the observer looking at an illuminated backscattering surface element instead of the light source. The observer looks through the transparent or translucent carrier substrate and thus through the plane of the pixel(s).

In the optoelectronic light emitting device according to the invention, a pixel comprises a transparent carrier substrate, which can also be partially transparent, i.e. translucent, and can, for example, be made of glass, sapphire or a transparent polymer. On the translucent carrier substrate, a pixel micro control unit and a semiconductor light emitting arrangement with at least one micro LED, which extends over a partial area of the pixel, are preferably arranged in such a way that the main radiation direction of the semiconductor light emitting arrangement is directed onto a backscattering surface element arranged behind the transparent carrier substrate in the viewing direction. The viewing direction is understood to be the viewing direction from the eye of an observer to the illuminated pixel area. The observer is located in front of the pixel area, which is thus located between the observer and the surface element.

Preferably, no direct light emission reaches the observer's eye from the semiconductor light emitting arrangement with at least one micro LED, so that only the electromagnetic radiation emanating from the illuminated, backscattering surface element and passing through the transparent or translucent carrier substrate is visible. Accordingly, the semiconductor light emitting arrangement generates a shadow cast, which, however, is assumed to be small compared to the illuminated pixel area due to the limited area extension of the micro LED used and is not perceptible to the observer.

In one embodiment of the invention, the further components arranged on the transparent or translucent carrier substrate for driving the micro LED are made of at least partially light-transmissive materials. This relates in particular to the control lines between the optional pixel micro control unit and the micro LED, which advantageously consists of a layer composite of electrically conductive materials that at the same time have a high optical transmittance. For this purpose, for example, structured layers with carbon nanotubes and transparent, electrically conductive polymers can be used. Alternatively, transparent conductive oxides (TCO), such as indium tin oxide, indium zinc oxide or $In_2O_3$, can be chosen for this purpose, for example.

In a further embodiment, the conductor tracks comprise a metal layer that is opaque, for example. The structures, which are only a few micrometers wide, can only slightly reduce the light transmission of the transparent or translucent carrier substrate and can not be visible to an observer.

To further reduce shadowing, the pixel micro control unit of the micro LED can be located in a pixel edge region above the optical isolators between adjacent pixels.

To reduce the depth of construction in the viewing direction, the distance between the semiconductor light emitting arrangement and the backscattering surface element in the main radiation direction can preferably be at most one third, particularly preferably at most one quarter of the pixel diagonal. This allows the use of flat spacers with correspondingly narrow base areas between the transparent or translucent carrier substrate and the backscattering surface element, which simplify the manufacture of the optoelectronic light emitting device and which additionally serve as optical insulators between adjacent pixels.

One manufacturing advantage can be that microscopic spacers are manufactured in a separate microstructuring process and are placed on the transparent or translucent carrier substrate in a precisely located manner in accordance with the semiconductor light emitting arrangement by means of an automated microhandling device and bonded to it cohesively. In a subsequent manufacturing step, the assembled transparent or translucent carrier substrate is then placed on the backscattering surface element.

In order to provide a small distance between the semiconductor light emitting arrangement and the backscattering surface element in connection with a large-area, homogeneous illumination of the backscattering surface element, for which preferably at least 80% of the area of the pixel emits with at least 50% of the maximum radiant intensity during operation, the semiconductor light emitting arrangement comprises a beam shaping element according to the invention.

For an exemplary embodiment, a vertically emitting micro LED is used and the beam shaping element comprises a micro optic that magnifies the divergence of the semiconductor light emitting arrangement. For example, the micro optic may have a prismatic profile and/or comprise a freeform cone and/or a lenslet array. Presently, a lenslet array is understood to be a matrix array of micro lenses (or of at least small lenses) of matching focal length. Alternatively, the beam shaping element may comprise a nano-optical component, for example a waveguide formed as a photonic crystal. For another exemplary embodiment, a side emitting micro LED is used and the beam shaping element comprises a combined refractive-reflective micro optic for enlarging and equalizing the illumination area on the backscattering surface element.

According to a further embodiment of the invention, the surface of the beam shaping element comprises scattering particles. Alternatively or additionally, a diffuser can be integrated into the semiconductor light emitting arrangement, the arrangement of which is adapted to the radiation characteristic of the micro LED used in such a way that the light propagation is broadened and preferably adapted for a non-circular illumination of, for example, a rectangular area on the backscattering surface element. Furthermore, radiation-absorbing components can be provided in the semiconductor light emitting arrangement to weaken the formation of local illumination maxima.

It is also possible to include a wavelength converter in the semiconductor light emitting arrangement, which leads to the formation of a micro unit that is easier to handle. Such a design is particularly advantageous if there are several micro LEDs with different emission spectra within the semiconductor light arrangement. This results in an alternative design for the color-differentiated light sources, for example an RGB arrangement, which are realized by assigning spectrally different wavelength converters for some of the micro LEDs.

If there are several micro LEDs within the semiconductor light emitting arrangement, they can be enclosed in a common beam shaping element. As an alternative to this simplified design, a separate beam shaping element can be provided for each micro LED of the semiconductor light emitting arrangement so that the illumination adjustment can be fine-tuned.

For a preferred embodiment, the beam shaping element associated with at least one micro LED is spaced from the backscattering surface element. For this embodiment, the cavity between the transparent or translucent carrier substrate and the backscattering surface element of a pixel can be vacuumed or air-filled. Also conceivable is a partial or complete filling of the region between the transparent or translucent carrier substrate and the backscattering surface element with an optically permeable material comprising optical scattering materials for an advantageous further embodiment. This filling forms a light guide and may comprise an immersion liquid, a film element, for example of ethylene vinyl acetate copolymer (EVA) or thermoplastic polyurethane (TPU), or a material layer of silicone.

For an advantageous design of the backscattering surface element, this has a planar surface at least in the pixel-wise illuminated area. For a preferred design, this is diffusely scattering, whereby for a possible realization a coating with titanium oxide particles (TiOx) in a material with a small refractive index, such as epoxy resin, silicone, polyacrylate or low refractive glass, is present. Alternatively, aluminum oxide, zirconium oxide and magnesium fluoride or organic particles such as methyl methacrylate, especially in a high refractive index matrix, can be used.

A directionally reflecting, backscattering surface element, which can be achieved, for example, by a metal coating, can be advantageous if an optoelectronic light emitting device that appears black when not in use and leads to a high light-dark contrast is to be realized.

For this or other purposes, a layer structure with a polarizer and a λ/4-platelet can be arranged on the transparent or translucent carrier substrate, which initially linearly polarizes scattered light from outside and converts it into circularly polarized radiation. With the directional reflection, a reversal of the circular polarization occurs, so that the back reflection through the layer structure is prevented after passing through the λ/4 platelet at the polarizer.

According to a further embodiment of the invention, also claimed herein in an independent claim, spacers are disposed between the transparent or translucent carrier substrate and the backscattering surface element, which additionally serve as optical isolators with respect to adjacent pixels. All of the features recited herein, individually or in combination, may also be provided in this further embodiment.

The spacers can thus not only be provided for setting a defined distance between the carrier substrate and the backscattering surface element, but they also serve as optical isolators between neighboring pixels. Cross talk between adjacent pixels can thus be reduced or avoided.

A diffuse scattering surface design of the spacers can be provided, so that they additionally contribute to the homogenization of the illumination on the backscattering surface element. For a preferred embodiment, the backscattering surface element can comprise a locally adapted reflectivity within a pixel. If several micro LEDs with different color characteristics are present in a pixel, the choice of coating for the backscattering surface element can limit a high degree of reflectivity only to those partial areas for which there is uniform illumination in terms of color. The perceptibility of spectrally inhomogeneous illuminated partial areas within a pixel can be suppressed by coating or a surface design of these areas of the backscattering surface element with reduced reflectivity. Furthermore, the reflectance of the backscattering surface element of a pixel can be adapted in a graduated manner. Such an embodiment is particularly advantageous if, in addition, a locally non-uniform illumination intensity is to be compensated.

Exemplary embodiments of the invention are explained below in connection with figure illustrations. These show, in each case schematically, the following:

Figure 1:
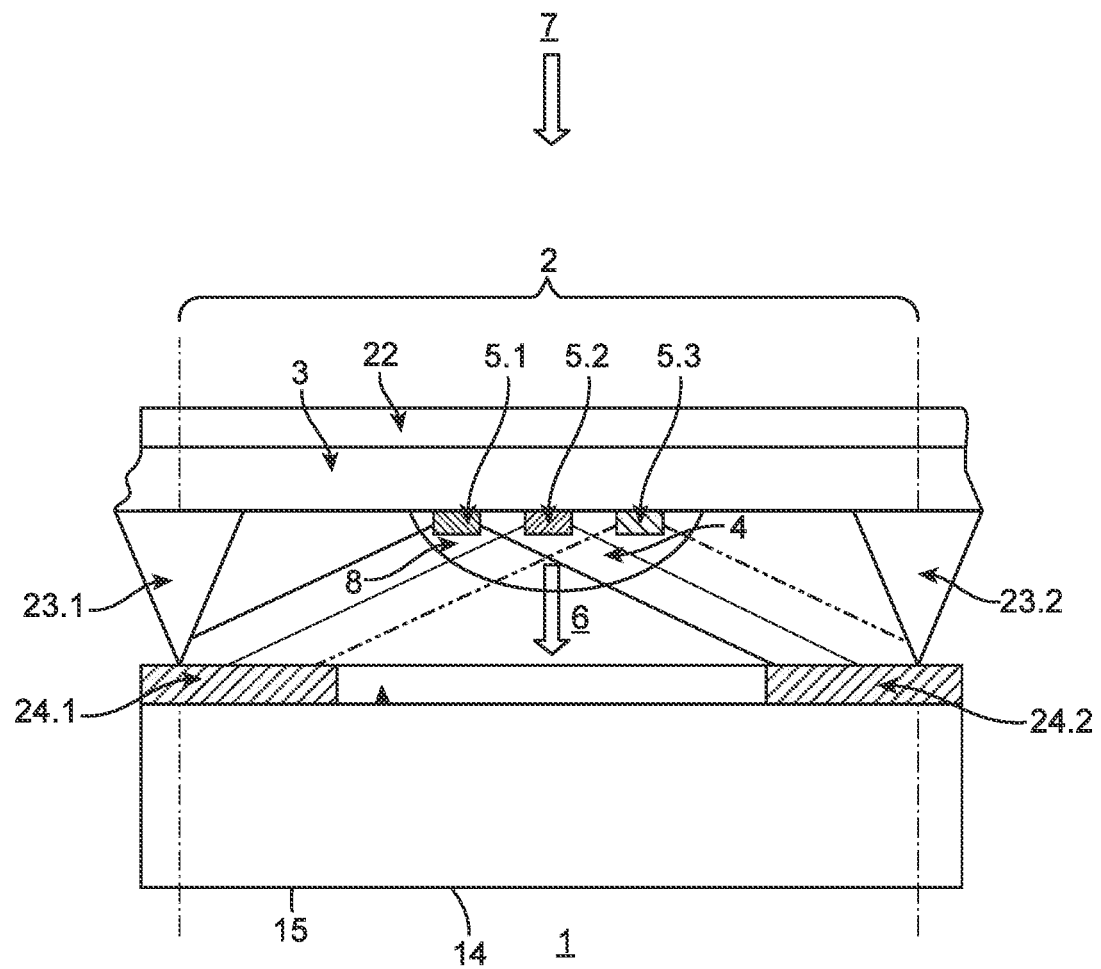
FIG. 1 shows a first variant of an optoelectronic light emitting device according to the invention.

The illustration of the first embodiment of the optoelectronic light emitting device 1 according to the invention as shown in FIG. 1 is schematically simplified. The optoelectronic light-emitting device 1 comprises a pixel 2 with a transparent or translucent carrier substrate 3, on which a semiconductor light emitting arrangement 4 with at least one micro LED 5.1, 5.2, 5.3, which extends over a partial area of the pixel 2, is arranged. Not shown in detail is an optional pixel micro control unit, whereby the functionality of the pixel control can also be provided in a higher-level device.

Three micro LEDs are shown in the example, whereby red light can be generated by means of micro LED 5.1, green light by means of micro LED 5.2, and blue light by means of micro LED 5.3. The example is thus an RGB pixel with three micro LEDs. By controlling the micro LEDs 5.1, 5.2, 5.3 accordingly, a large variety of colors can be produced according to the RGB color model.

A main radiation direction 6 of the semiconductor light emitting arrangement 4 is directed towards a backscattering surface element 14 arranged behind the transparent or translucent carrier substrate 3 in the viewing direction 7. The main radiation direction 6 thus runs at least essentially parallel to the viewing direction 7.

For an illustrated pixel 2, a semiconductor light emitting arrangement 4 with three micro LEDs 5.1, 5.2, 5.3 is thus located on the backside of a transparent or translucent carrier substrate 3 in the viewing direction 7. The semiconductor light emitting arrangement 4 extends only over a partial area of the pixel 2, so that a backscattering surface element 14 illuminated by the semiconductor light emitting arrangement 4 with the main radiation direction 6 emits large-area electromagnetic radiation to the observer through the transparent or translucent carrier substrate 3.

The backscattering surface element 14 comprises a planar surface with a reflective layer 15 which, for a first embodiment not shown in detail, can be diffusely reflective and, in particular, consists of a material composite of a layer material with a low refractive index, such as epoxy resin, silicone, polyacrylate or a low-refractive glass, and titanium oxide particles. For a second embodiment shown, a directionally reflective layer 15 formed by a metallization is present which, in order to improve the dark contrast, in combination with a layer structure of polarizer and λ/4-platelets 22 on the transparent or translucent carrier substrate 3, prevents the light incident from outside from re-emerging.

For homogeneous illumination of the backscattering surface element 14, the semiconductor light emitting arrangement 4 comprises a beam shaping element 8 which encloses the three vertical emitting i.e. in the main radiation direction 6, micro LEDs 5.1, 5.2, 5.3 by means of a micro optic 9.1, 9.2 increasing the divergence of the semiconductor light emitting arrangement 4. By amplifying the lateral radiation of the semiconductor light emitting arrangement 4, a large-format and uniform illumination of the visible light emitting area can be achieved even for a small distance between the transparent or translucent carrier substrate 3 and the backscattering surface element 14, so that spacers 23.1, 23.2 formed as microelements can be used between the transparent or translucent carrier substrate 3 and the backscattering surface element 14. These are additionally used as optical insulators to neighboring pixels not shown in detail.

The spacers 23.1, 23.2 can be manufactured, for example, for simplified production of the optoelectronic light emitting device 1 according to the invention, to the semiconductor light emitting arrangement 4 with the micro LEDs 5.1, 5.2, 5.3 correspondingly as micro assembly units by means of a separate structuring process, then arranged in a precise position on the transparent or translucent carrier substrate 3 and joined with it cohesively.

The beam shaping element 8 enables a reduced distance between the semiconductor light emitting arrangement 4 and the backscattering surface element 14 in the main radiation direction 6, which is preferably at most one third, particularly preferably at most one quarter, of the pixel diagonal, with a simultaneously large-area, homogeneous illumination of the backscattering surface element 14, for which preferably at least 80% of the area of the pixel emits with at least 50% of the maximum radiant intensity during operation. To equalize the spectral emission, a coating with low reflectivity 24.1, 24.2 is preferably provided on the partial areas of the backscattering surface element 14 for which spectrally inhomogeneous illumination is present. These partial areas are shown oversized in the schematically simplified illustration for clarification, whereby their expansion can be limited to a small area by means of the beam shaping element 8 and a concentrated arrangement of the micro LEDs 5.1, 5.2, 5.3.

Figure 2:
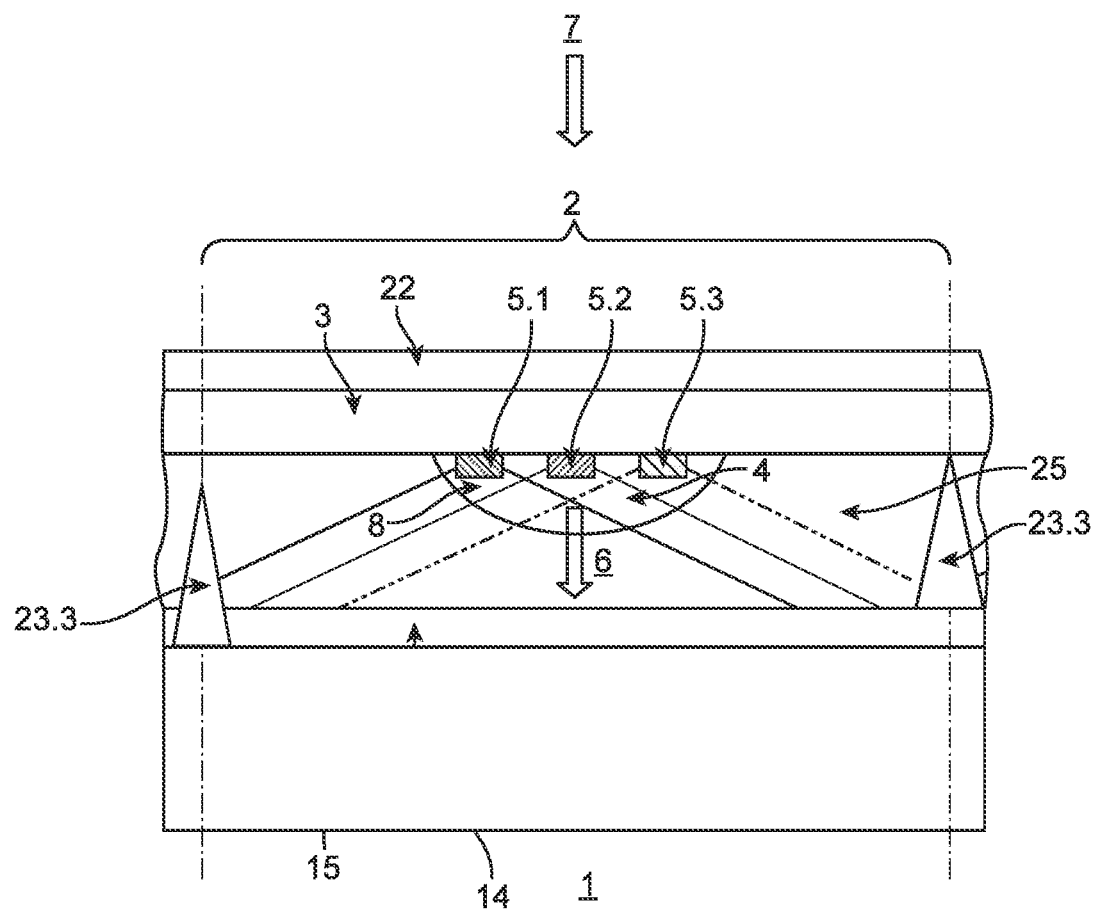
FIG. 2 shows a second variant of an optoelectronic light emitting device according to the invention.

FIG. 2 shows a second embodiment of the optoelectronic light emitting device 1 according to the invention in schematic simplification, whereby the components corresponding to the first embodiment are designated with the same reference signs. For the embodiment shown, the region between the transparent or translucent carrier substrate 3, which carries the semiconductor light emitting arrangement 4 with the micro LEDs 5.1, 5.2, 5.3 and the beam shaping element 8 on its backside, and the backscattering surface element 14 is filled with a light-guiding element 25. For this purpose, an immersion liquid, a foil element, for example made of ethylene vinyl acetate copolymer (EVA) or thermoplastic polyurethane (TPU), or a material layer made of silicone can be used.

Furthermore, the embodiment shown in FIG. 2 comprises a spacer 23.3, which is placed on or deposited and/or structured on the backscattering surface element 14. The spacer 23.3 serves as a support component and for optical demarcation from an adjacent pixel. In this context, the spacer 23.3 need not extend over the entire pixel circumference. Instead, at least one optical isolator 26 is additionally present on the backscattering surface element 14, wherein the optical isolator 26 has a height extension that is optically effective for the barrier function but does not extend to the transparent or translucent carrier substrate 3. For one possible embodiment, the spacer 23.3 and/or the optical isolator 26 are formed on the backscattering surface element 14 by light-guided electrophoretic deposition (EPD) or 3D printing.

Figure 3:
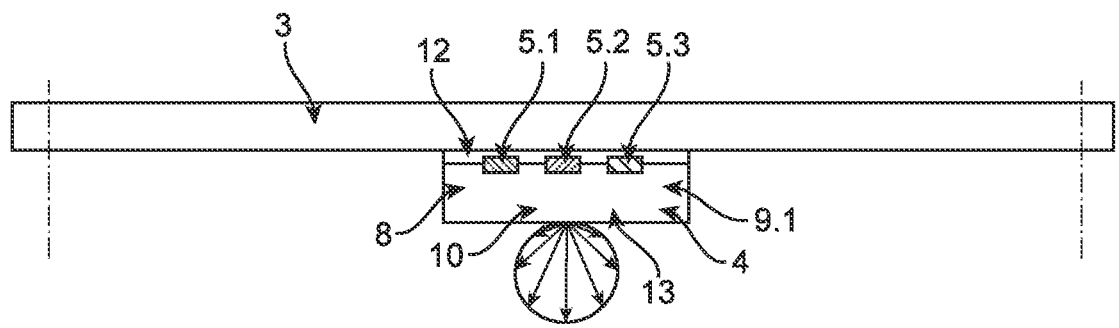
FIG. 3 shows a partial section of a third variant of an optoelectronic light emitting device according to the invention in side view.
Figure 4:
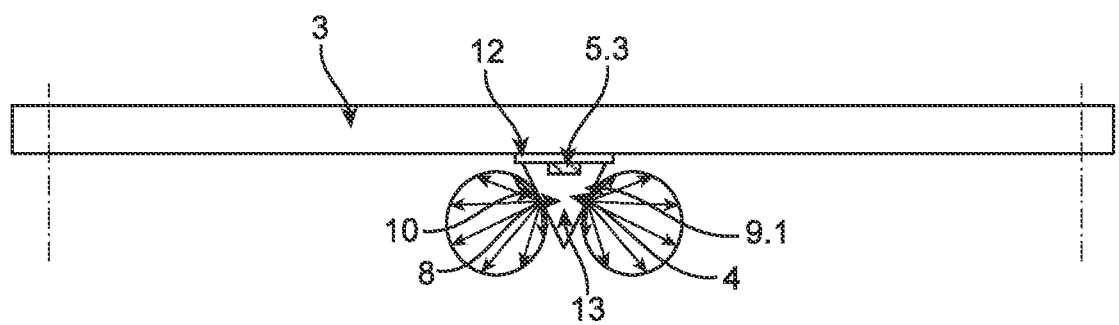
FIG. 4 shows a partial section of the third variant of the optoelectronic light emitting device according to the invention in front view.

An advantageously designed micro optic 9.1 of the semiconductor light emitting arrangement 4 for micro LEDs 5.1, 5.2, 5.3 in series arrangement is shown in FIGS. 3 and 4 as a schematically simplified side and front view. A beam-widening prism profile 10 is evident when viewed in the direction of the serial arrangement of the micro LEDs 5.1, 5.2, 5.3.

In addition, the semiconductor light emitting arrangement 4 comprises a diffuser 13, wherein the micro assembly of micro LEDs 5.1, 5.2, 5.3, diffuser 13 and prismatically shaped micro optic 9.1 is attached to the transparent or translucent carrier substrate 3 by means of a reflective adhesive layer 12.

Figure 5:
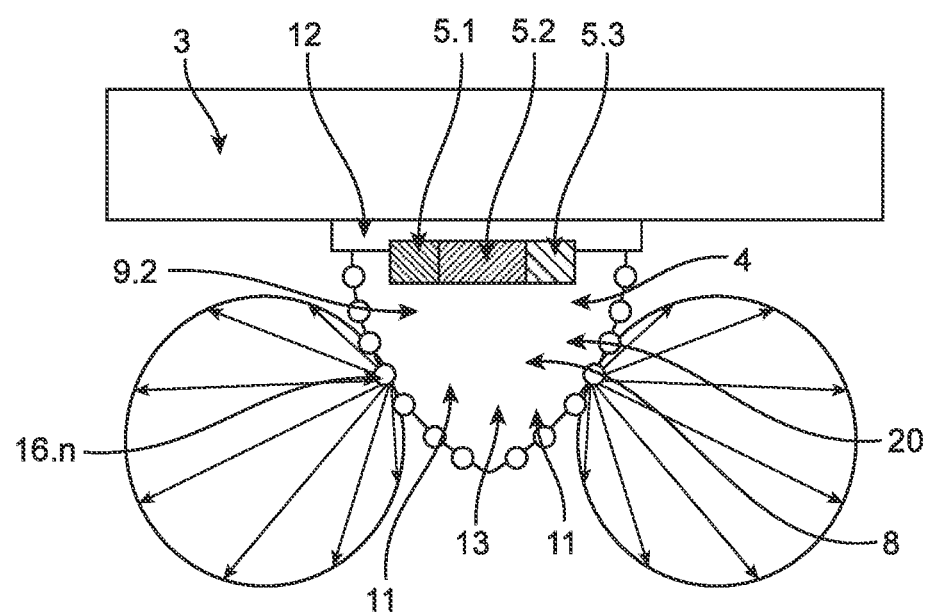
FIG. 5 shows a partial section of a fourth variant of an optoelectronic light emitting device according to the invention in side view.

To illustrate the fourth variant, FIG. 5 shows a semiconductor light emitting arrangement 4 with three differently colored micro LEDs 5.1, 5.2, 5.3 in a triangular arrangement covered by a micro optic 9.2, which is formed as a free-form cone 11 with scattering particles 16.n on the surface or in the volume. For an embodiment not shown in detail, scattering particles are present in the volume of the micro optic 9.2.

Figure 6:
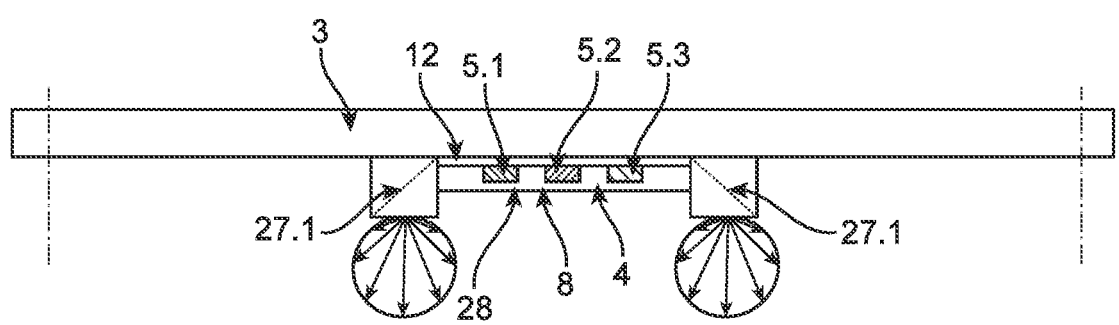
FIG. 6 shows a partial section of a fifth variant of an optoelectronic light emitting device according to the invention in side view.

FIG. 6 shows schematically simplified a fifth variant of the semiconductor light emitting arrangement 4 with three differently colored micro LEDs 5.1, 5.2, 5.3, which are designed as side emitters. The beam shaping element 8, which receives the light emitted by the micro LEDs 5.1, 5.2, 5.3, comprises a nano-optical waveguide 28 and a combined refractive-reflective micro optic 27.1, 27.2 laterally connected to it.

For further development of the semiconductor light emitting arrangement 4 not shown in detail, this can comprise a wavelength converter. Further embodiments result from the following claims.

LIST OF REFERENCE SIGNS 1 optoelectronic light emitting device
2 pixel
3 transparent or translucent carrier substrate
4 semiconductor light emitting arrangement
5.1-5.3 micro LED
6 main radiation direction
7 viewing direction
8 beam shaping element
9.1, 9.2 micro optic
10 prism profile
11 freeform cone
12 adhesive layer
13 diffuser
14 backscattering surface element
15 reflective layer
16.n scattering particles
20 common beam shaping element
22 layer structure of polarizer and λ/4 platelets
23.1, 23.2 spacer
23.3 spacer
24.1, 24.2 coating with low reflectivity
25 light guide element
26 optical isolator
27.1, 27.2 combined refractive-reflective micro optic
28 nano-optical waveguide

The invention claimed is:

1. An optoelectronic light emitting device comprising a pixel with
   a transparent or translucent carrier substrate on which a semiconductor light emitting arrangement with at least one micro LED extending over a partial area of the pixel is arranged,
   wherein a main radiation direction of the semiconductor light emitting arrangement is directed towards a backscattering surface element arranged behind the transparent or translucent carrier substrate in viewing direction; and
   the semiconductor light emitting arrangement comprises a beam shaping element.

2. The optoelectronic light emitting device according to claim 1, wherein the micro LED is configured to be vertically emitting and/or the beam shaping element comprises a micro optic increasing the divergence of the semiconductor light emitting arrangement.

3. The optoelectronic light emitting device according to claim 2, wherein the micro optic comprises a prism profile and/or a freeform cone and/or a lenslet array.

4. The optoelectronic light emitting device according to claim 1, wherein the micro LED is configured to be side emitting and/or the beam shaping element comprises a combined refractive-reflective micro optic.

5. The optoelectronic light emitting device according to claim 1, wherein the beam shaping element comprises scattering particles on the surface.

6. The optoelectronic light emitting device according to claim 1, wherein the semiconductor light emitting arrangement comprises a diffuser and/or a wavelength converter.

7. The optoelectronic light emitting device according to claim 1, wherein the semiconductor light emitting arrangement comprises several micro LEDs with different emission spectra and/or spectrally different, associated wavelength converters.

8. The optoelectronic light emitting device according to claim 7, wherein a common beam shaping element is associated with the micro LEDs in the semiconductor light emitting arrangement.

9. The optoelectronic light emitting device according to claim 7, wherein at least one and preferably each micro LED in the semiconductor light emitting arrangement is associated with a separate beam shaping element.

10. The optoelectronic light emitting device according to claim 1, wherein the backscattering surface element comprises a planar surface, and/or wherein, in particular for equalizing the spectral emission, a coating with low reflectivity is provided on partial areas of the backscattering surface element which can spectrally inhomogeneously be illuminated.

11. The optoelectronic light emitting device according to claim 1, wherein the backscattering surface element is configured to be diffusely scattering.

12. The optoelectronic light emitting device according to claim 1, wherein the backscattering surface element is configured to be directionally reflective and a layer structure with a polarizer and a $\lambda/4$ platelet is arranged on the transparent or translucent carrier substrate.

13. The optoelectronic light emitting device according to claim 1, wherein control lines between a pixel micro control unit and the micro LED consist of a transparent or translucent material.

14. An optoelectronic light emitting device comprising a pixel with
a transparent or translucent carrier substrate on which a semiconductor light emitting arrangement with at least one micro LED extending over a partial area of the pixel is arranged,
wherein the main radiation direction of the semiconductor light emitting arrangement is directed towards a backscattering surface element arranged behind the transparent or translucent carrier substrate in viewing direction,
in particular light emitting device according to claim 1,
wherein spacers are arranged between the transparent or translucent carrier substrate and the backscattering surface element, which additionally serve as optical insulators with respect to adjacent pixels.

15. A method for manufacturing an optoelectronic light emitting device according to claim 1,
wherein a pixel micro control unit and control lines extending therefrom are applied to a transparent or translucent carrier substrate to form a pixel; and
at least one micro LED and at least one beam shaping element are connected to form a semiconductor light emitting arrangement which is fixed to the transparent or translucent carrier substrate and is electrically contacted with the control lines, the semiconductor light emitting arrangement extending over a partial area of the pixel; and
wherein spacers are arranged on the transparent or translucent carrier substrate; and
in a subsequent manufacturing step, the equipped, transparent or translucent carrier substrate is connected to a backscattering surface element in such a way that the backscattering surface element is arranged behind the transparent carrier substrate in viewing direction and the main radiation direction of the semiconductor light emitting arrangement points towards the backscattering surface element.

* * * * *